(12) United States Patent
Petrucci et al.

(10) Patent No.: US 6,686,254 B2
(45) Date of Patent: Feb. 3, 2004

(54) SEMICONDUCTOR STRUCTURE AND METHOD FOR REDUCING CHARGE DAMAGE

(75) Inventors: Joseph Petrucci, New Milford, CT (US); John Maltabes, Austin, TX (US); Karl Mautz, Austin, TX (US); Alain Charles, Singapore (SG)

(73) Assignee: Motorola, Inc., Schaumburg, IL (US)

( * ) Notice: Subject to any disclaimer, the term of this patent is extended or adjusted under 35 U.S.C. 154(b) by 40 days.

(21) Appl. No.: 09/842,453

(22) Filed: Apr. 27, 2001

(65) Prior Publication Data

US 2002/0158348 A1 Oct. 31, 2002

(51) Int. Cl.[7] .................................. H01L 21/76
(52) U.S. Cl. .................. 438/401; 438/400; 438/694; 438/597; 438/622; 438/669; 257/356; 257/362
(58) Field of Search ................... 438/401, 400, 438/694, 597, 622, 669, 710, 259; 257/356, 362

(56) References Cited

U.S. PATENT DOCUMENTS

| | | | | | |
|---|---|---|---|---|---|
| 5,760,445 | A | * | 6/1998 | Diaz | 257/356 |
| 5,767,006 | A | * | 6/1998 | Lee | 438/597 |
| 5,817,577 | A | * | 10/1998 | Ko | 438/599 |
| 5,844,282 | A | * | 12/1998 | Noguchi | 257/356 |
| 5,963,816 | A | * | 10/1999 | Wang et al. | 438/401 |
| 5,986,308 | A | * | 11/1999 | Gradenwitz | 257/356 |
| 5,998,299 | A | * | 12/1999 | Krishnan | 216/18 |
| 6,235,642 | B1 | * | 5/2001 | Lee et al. | 438/259 |
| 6,277,708 | B1 | * | 8/2001 | Bothra et al. | 257/328 |
| 6,309,979 | B1 | * | 10/2001 | Patrick et al. | 438/706 |
| 6,323,076 | B1 | * | 11/2001 | Wilford | 438/215 |
| 6,429,090 | B1 | * | 8/2002 | Fujiwara et al. | 438/4 |

* cited by examiner

Primary Examiner—Richard Elms
Assistant Examiner—Michael K. Luhrs

(57) ABSTRACT

A semiconductor method for reducing charge damage during plasma etch processing is disclosed. Structures (22, 26, 28) for accumulating charge during plasma etch processing are provided on a semiconductor wafer (10), the structures (22, 26, 28) being electrically connected to device structures (30, 32).

3 Claims, 1 Drawing Sheet

SEMICONDUCTOR STRUCTURE AND METHOD FOR REDUCING CHARGE DAMAGE

FIELD OF THE INVENTION

The present invention generally relates to a semiconductor structure for reducing charge damage, and more particularly to a semiconductor structure for reducing charge damage during plasma etch processing.

The present invention further generally relates to a method for reducing charge damage, and more particularly to a method for reducing charge damage during plasma etch processing.

BACKGROUND OF THE INVENTION

Generally, semiconductor devices are fabricated on a semiconductor substrate by several processing steps. One processing operation that is well-known in the art is plasma etch processing. Such plasma etch processing operations are designed to pattern the various layers, e.g. substrate, oxide, and metallization layers, in order to construct the desired circuit layout.

However, during plasma etch processing, charge damage can occur when conductive areas become isolated and act as a capacitor by trapping charge that discharges through the dielectric films in the silicon substrate. This is a problem that has been an issue for plasma etch processing for many years. In order to minimize the probability of damaging primary device features in active areas it is important that the device features are prevented from acting as an antenna, and thus to prevent the primary device features from trapping or accumulating charge. Generally speaking, the antenna capacitance ratio has to be minimized, so that the amount of charge that is accumulated due to the antenna effect is minimized; further, charge that is trapped due to the capacitor effect should be prevented from discharging through the dielectric film into the silicon substrate.

However, it is not always possible to achieve a satisfying design with respect to the above mentioned antenna capacitance ratio. Thus, further measures have to be taken in order to remove the charge from the primary device features, and thus to prevent charge damage.

The present invention seeks to solve the above mentioned problems and to provide a semiconductor structure and a method that allow for prevention of charge damage during plasma etch processing in an reliable and efficient way.

DETAILED DESCRIPTION OF PREFERRED EMBODIMENTS

Figure 1:
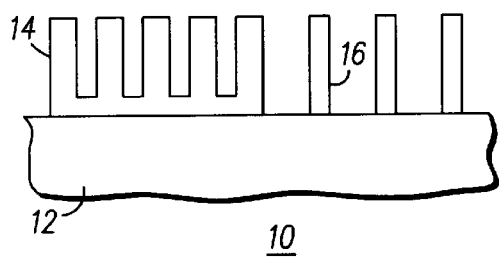
FIG. 1 is a partial schematic cross-sectional view of a semiconductor wafer.

According to the invention, a semiconductor structure for reducing charge damage during plasma etch processing is provided wherein structures 22, 26, 28 for accumulating charge during plasma etch processing are provided on a semiconductor wafer 10, the structures 22, 26, 28 being electrically connected to device structures 32.

According to the invention, there is further provided a method for reducing charge damage during plasma etch processing, the method comprising the steps of: providing structures 22, 26, 28 for accumulating charge on a semiconductor wafer 10, connecting the structures 22, 26, 28 electrically to device structures 32, performing a plasma etch process, and maintaining the connection during the plasma etch process.

Due to the structures 22, 26, 28 for accumulating charge, an excessive charging of device features may be prevented. For example, the structures 22, 26, 28 for accumulating charge can be additional features on the wafer that are optimized for charge accumulation. The present invention is particularly advantageous when optical features, for example overlay targets and/or alignment structures are used as the structures 22, 26, 28 for accumulating charge. Also, electric/parametric test structures can be redesigned so that an optimized accumulating of charge may be provided by such structures.

For example, the antenna properties can be provided to the structures 22, 26, 28, e.g. to the optical features, by segmenting the structures 22, 26, 28 into smaller features.

Preferably, the structures 22, 26, 28 for accumulating charge are located in the kerf area. For example, optical features like alignment marks are located in the kerf area. Redesigning such structures 22, 26, 28 as structures for accumulating charge, thereby generating a double function, is particularly advantageous. However, these structures 22, 26, 28 that are printed during the lithography step must not be completely etched during the plasma etch process until the last stages of etching. Thus, the structures 22, 26, 28 are able to advantageously act as structures for accumulating charge over the whole plasma etch processing.

The structures 22, 26, 28 for accumulating charge remove the charge from the device features due to a electrical connection, for example by connecting the structures 22, 26, 28 to a grounded edge seal 32.

It is desirable that the connection is maintained until the plasma etch processing is completed or until etch steps are completed that are the most damaging to a device. Thus, the connection should for example be maintained until the higher power/dc bias etch steps are completed. Also, it may be desirable that the connection is active until the last stages of the overetch step.

Thus, in contrast to a normal plasma etch processing, where all structures are defined before the overetch step, in the case of the present invention the structures can still be defined during the overetch step, thereby providing the possibility to bleed off charge from the active components during all of the critical plasma etch processing steps.

Although the present invention is particularly advantageous when existing structures are used for a reduction of charge damage, it is also possible to add new structures for the same purpose.

FIG. 1 shows a schematical cross-sectional view of a part of a semiconductor wafer 10. On a substrate 12 a metal layer 14 is provided. The metal layer 14 was patterned by a plasma etch process. On the left side of the metal layer 14 the metal structures are closer together than on the right side of the metal layer 14. Since the features on the left side of the metal layer 14 are close together there is still some metal on the bottom of the metal layer 14, which is a typical effect of plasma etching. Thus, the device features on the left side of the metal layer 14 are still electrically connected. On the other hand, the device features on the right side have a larger separation so that the bottom part of the metal layer is already cleared by the plasma etch processing. Consequently, the device features on the right side of the metal layer 14 are electrically isolated. Therefore, on the right side of the metal layer 14, charge may be trapped in certain regions 16 that can cause damage. There can be residual charges that are trapped either within the metal features or just below the metal features. Since the metal features are isolated, they act as a capacitor.

Figure 2:
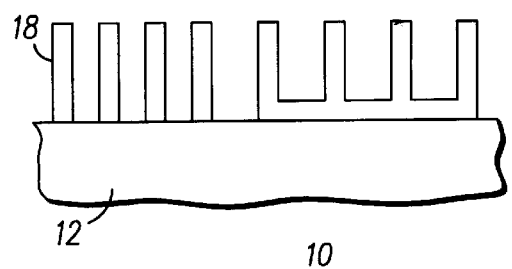
FIG. 2 is a partial schematic cross-sectional view of a further semiconductor wafer.

FIG. 2 shows a different example of a semiconductor wafer 10 with a silicon substrate 12 and a polysilicon layer 18 thereon. In the case of FIG. 2, after etching of the polysilicon layer 18 there is still material on the bottom of the polysilicon layer 18 between polysilicon features that are further apart. There may be several reasons for the remaining polysilicon film on the bottom of the polysilicon layer 18. For example, the film on the side of the structures that are further apart might have been thicker, so that a longer etching time is required. Another reason may be that there is a topography on the layers below the polysilicon layer 18.

Thus, FIG. 1 and FIG. 2 show different examples of remaining electrical connection between device features during a plasma etching process. It should be noted that for different film materials the effect of the spacing of structures on the etching rate can be different. Therefore, the spacing of structures can be optimized in order to achieve the desired effect on the etching rate.

In the following it will be described how the different behavior of different structures during plasma etching may be utilized in relation to the present invention.

Figure 3:
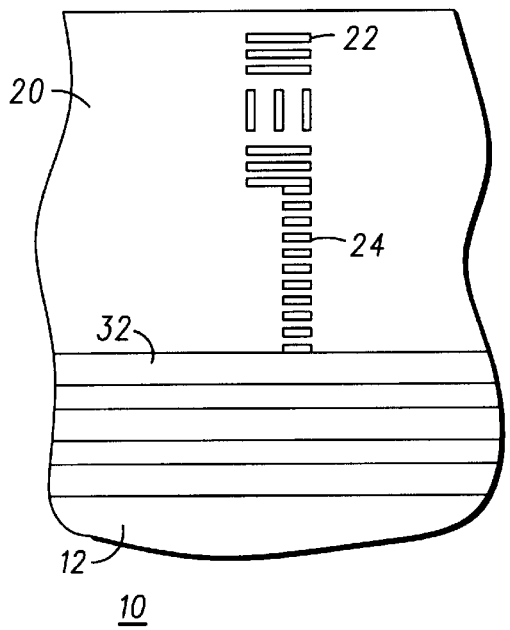
FIG. 3 is a partial schematic top view of a semiconductor wafer showing a structure according to the present invention.

FIG. 3 is a top view of a part of a semiconductor wafer 10 comprising of a substrate 12 and structures thereon. The semiconductor wafer 10 has a kerf area 20 in which an optical feature 22 is located. In the present case the optical feature 22 is represented by alignment marks that are used during exposure during a lithography process. Further, the silicon wafer 10 is provided with an active area which is in the present case represented by conductive pads that act as a ground seal 32. The alignment marks 22 are connected to the ground seal 32 by a conducting path 24 that acts as a fusable conductor. So the alignment marks 22 may act as an antenna for accumulating charge, and the charge may be drawn away from the active area through the fusable conductor 24. Such fusable conductor 24 and the alignment marks 22 should be present in the plasma etching process during all steps that might produce a charge damaging to device structures. By the end of the plasma etch processing, the fusable conductor 24 and the alignment marks 22 may be cleared.

Figure 4:
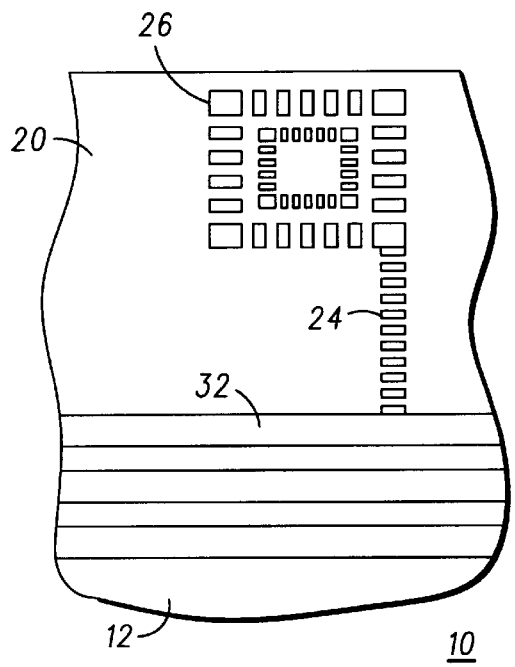
FIG. 4 is a partial schematic top view of a semiconductor wafer showing a further structure according to the present invention.

FIG. 4 shows a different example of a semiconductor wafer 10 comprising of a substrate 12 with structures thereon. Again, a top view of a part of a semiconductor wafer 10 is shown. In the present case the optical feature is an overlay structure that is used for metrology purposes, a so called "box and box". Normally, the box and box is used in order to determine the alignment quality of a previous step. Now, the box and box may still be used for such purpose, but on the basis of the invention it is also used as an antenna. Since the overlay structure 26 is connected to the ground seal 32 and/or to the active area by a fusable conductor 24, it is acting as a charge reservoir drawing away damaging charge from the active components.

Figure 5:
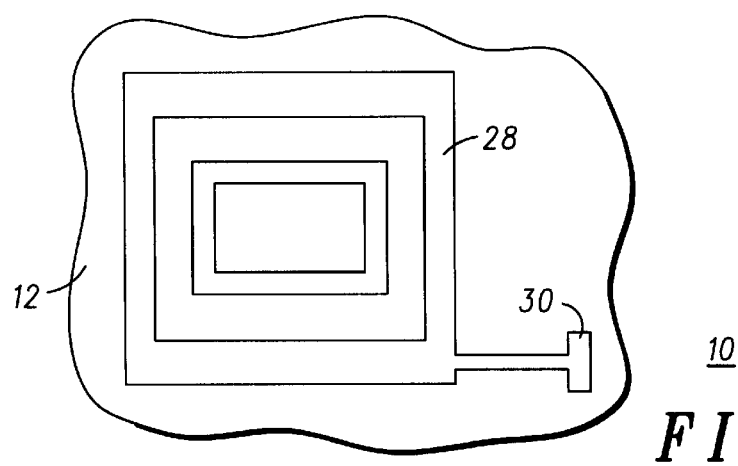
FIG. 5 is a partial schematic top view of a semiconductor wafer showing a test set up.

FIG. 5 also shows a top view of a semiconductor wafer 10. On the silicon substrate 12 there is again a box and box arrangement 28 that is connected to a test capacitor 30. By this arrangement different structures can be tested during plasma etch processing. The testing is achieved by determining whether the test capacitor 30 is damaged or modified based on the charge that the optical feature 28 is collecting. Thus, such structures can be used as a monitor for charge damage after an etching process.

Above, a semiconductor structure and a method for reducing charge damage during plasma etch processing has been described. However, an added benefit of the invention is that these structures can also act as a corrosion indicator with respect to electrochemical potential generated in liquid clean solutions, such as alkali-amine solutions. In particular, aluminum films that have trapped charge are easily damaged in such cleaning solvents.

While the invention has been described in terms of particular structures, devices and methods, those of skill in the art will understand based on the description herein that it is not limited merely to such examples and that the full scope of the invention is properly determined by the claims that follow.

What is claimed is:

1. A method for reducing charge damage during plasma etch processing of a metal layer on a semiconductor wafer having an active region and a kerf regions, wherein the kerf region has a ground seal, the method comprising the steps of:

forming structures in the kerf region during the plasma etch processing that are alignment marks, are for accumulating charge on the semiconductor wafer during the plasma etch processing, and are connected to the ground seal;

connecting the structure electrically to device structures in the active region during the plasma etch processing;

performing the plasma etch processing; and maintaining the connection during the plasma etch processing until the end of the plasma etch processing, wherein the connection is broken at the end of the plasma etch processing.

2. A method according to claim 1, further comprising the step of maintaining the structures until higher power/dc bias etch steps are completed.

3. The method of claim 1, wherein the structures are segmented prior to the plasma etch processing so that the structures are broken during the plasma etch processing.

* * * * *